United States Patent [19]

Yano

[11] 4,122,364

[45] Oct. 24, 1978

[54] VOLTAGE-CONTROLLED PHASE SHIFTER CIRCUIT FOR AN ELECTRONIC MUSICAL INSTRUMENT

[75] Inventor: Daihachiro Yano, Higashi-Kurume, Japan

[73] Assignee: Hillwood Electronic Musical Instruments Corporation, Higashi-Kurume, Japan

[21] Appl. No.: 784,936

[22] Filed: Apr. 5, 1977

[30] Foreign Application Priority Data

Apr. 12, 1976 [JP] Japan .................................. 51-40989

[51] Int. Cl.$^2$ .......................... H03K 1/12; G10H 5/04

[52] U.S. Cl. .................................... 307/262; 328/202; 331/108 B; 84/1.26

[58] Field of Search ................ 84/1.24, 1.25; 307/262; 328/202; 331/108 B

[56] References Cited

U.S. PATENT DOCUMENTS

| | | | |
|---|---|---|---|
| 3,688,010 | 8/1972 | Freeman | 84/1.25 X |
| 3,852,624 | 12/1974 | Marik et al. | 307/262 X |
| 3,854,367 | 12/1974 | Ryon | 84/1.25 |
| 3,983,512 | 9/1976 | Lipscombe | 307/262 X |

*Primary Examiner*—John S. Heyman

*Attorney, Agent, or Firm*—Haseltine, Lake & Waters

[57] ABSTRACT

A phase shifter circuit in electronic musical instruments, in which sound effects are generated by varying the amount of phase shift through voltage control. The amount of a shift may be linearly varied by an external voltage, and the operating point of the phase modulation can be freely set over a substantially wide range. The amount of phase shift, furthermore, may be made large so that a circuit stage having a pair of transistors is designated as a unit, and several such units are cascode-connected. Adjustment of this unit is not required.

6 Claims, 7 Drawing Figures

VOLTAGE-CONTROLLED PHASE SHIFTER CIRCUIT FOR AN ELECTRONIC MUSICAL INSTRUMENT

BACKGROUND OF THE INVENTION

This invention relates to a phase shifter circuit for use in an electronic musical instrument. More particularly, it relates to a phase shifter circuit which, when used in combination with an electronic musical instrument such as an electronic organ, is suitable to bestow sound effects called the vibrato effect, the chorus effect, the tremolo effect etc. by varying the quantity of phase shift by a voltage.

The phase shifter circuit for bestowing the effects when used in the musical instrument has heretofore been proposed in several forms though small in number. As typical ones, there are known a phase shifter circuit employing an FET and a phase shift modulation system based on the AM modulation.

In case of the phase shifter circuit employing the FET, the characteristics of the FET's to be used have a considerable dispersion, so that the drain-source admittances differ considerably for an identical gate-source voltage. Besides, the drain-source admittance varies abruptly in response to gate-source voltages of a narrow range of about 1.0 V – 1.5 V, so that the phase shift - versus - control voltage characteristic of the phase shifter circuit becomes very indeterminate. In the actual use, it is necessary to adjust the FET's one by one after assembling the circuits or to select FET's of uniform characteristics before the employment. The quantity of linear variable phase shift per stage of FET is considerably small. Where the multistage connection is adopted in order to attain a large quantity of phase shift, an adjustment for making the characteristics of the respective FET's uniform is troublesome. In order to avoid the disadvantages inherent to the FET, there has been further proposed a circuit in which a capacitor and an FET are connected in series with the emitter of a transistor, a capacitor is connected to the collector thereof, and the terminals are connected in common for an output end, or a circuit which employs an operational amplifier. However, the former has the disadvantage that, since the output impedance on the collector side cannot be made very low, the amplitude becomes small at high frequencies. The latter has the disadvantage that the cost becomes high due to the employment of the operational amplifier.

In case of the phase shift modulation system based on the AM modulation, the phase shifter circuit becomes complicated. Besides, since the system itself originally intends the phase modulation by low frequencies, the voltage control by d.c. is difficult to be realized and the band in which the phase modulation is done is narrow.

This invention proposes a voltage-controlled phase shifter circuit for an electronic musical instrument as has eliminated all the disadvantages attendant upon the prior-art phase shifter circuits.

SUMMARY OF THE INVENTION

Basically, the phase shifter circuit according to this invention is so constructed that the circuit comprises a pair of transistors as a basic unit, means connected to the emitter of each of said pair of transistors for changing the current flowing in the emitter-collector of each of said pair of transistors in a relation of opposite phase to each other with respect to the signal to be shifted and means for changing the current flowing in the emitter-collector of each of said pair of transistors in a relation of the same phase to each other with respect to the control voltage for the mount of phase shift, one of said pair of transistors having its emitter connected with the collector of the other of said pair of transistors through an impedance conversion circuit and a capacitor and the other of said pair of transistors having its emitter connected with the collector of the one of said pair of transistors through an impedance conversion circuit and a capacitor, whereby the signal derived at the collectors of said pair of transistors is phase-shifted from the signal applied to the emitters of said pair of transistors. In the phase shifter circuit of this invention, a variable resistance being one of the fundamental phase shifting elements is used to exploit the base-emitter characteristic of a transistor, i.e., the characteristic in which the base-emitter impedance is inversely proportional to the emitter current.

In accordance with this invention, the quantity of phase shift can be linearly varied by an external voltage, and the operating point of the phase modulation can be freely set over a considerably wide range. Further, the quantity of phase shift can be made large in such a way that a circuit stage constituted by a pair of transistors of the basic phase shifter circuit is made to be a unit and that several such units are cascode-connected. Moreover, in that case, the adjustment of each unit need not be made. Accordingly, a smooth modulation is applied in the musical instrument, and sound effects far more excellent than those in the prior arts are achieved.

Hereunder, this invention will be described with reference to the accompanying drawings in which;

DESCRIPTION OF THE PREFERRED EMBODIMENTS

Figure 1:
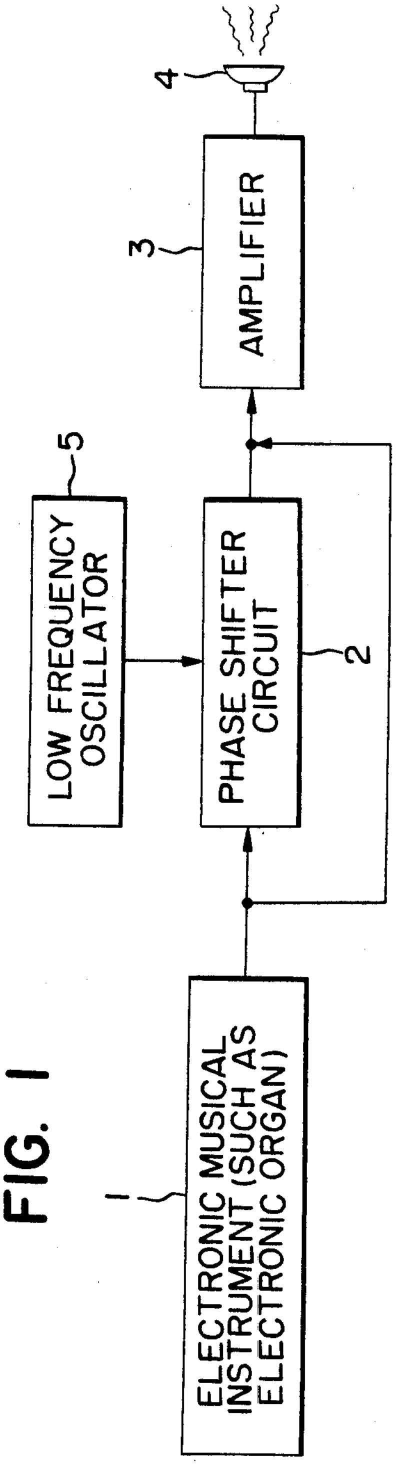
FIG. 1 is a schematic circuit diagram showing the connection between a phase shifter circuit according to this invention and an electronic musical instrument.

FIG. 1 shows the relation of connection in the case where a phase shifter circuit is used in combination with an electronic musical instrument. Numeral 1 designates the electronic musical instrument such as an electronic organ. A signal given forth herefrom is fed to the phase shifter circuit 2 and is subjected to phase modulation. The modulated signal is mixed with the signal directly coming from the electronic musical instrument 1. The mixed signal is fed to an amplifier 3. After the amplification, a sound is given forth from a speaker 4. Shown at 5 is a low frequency oscillator for controlling the phase shifter circuit.

Figure 3:
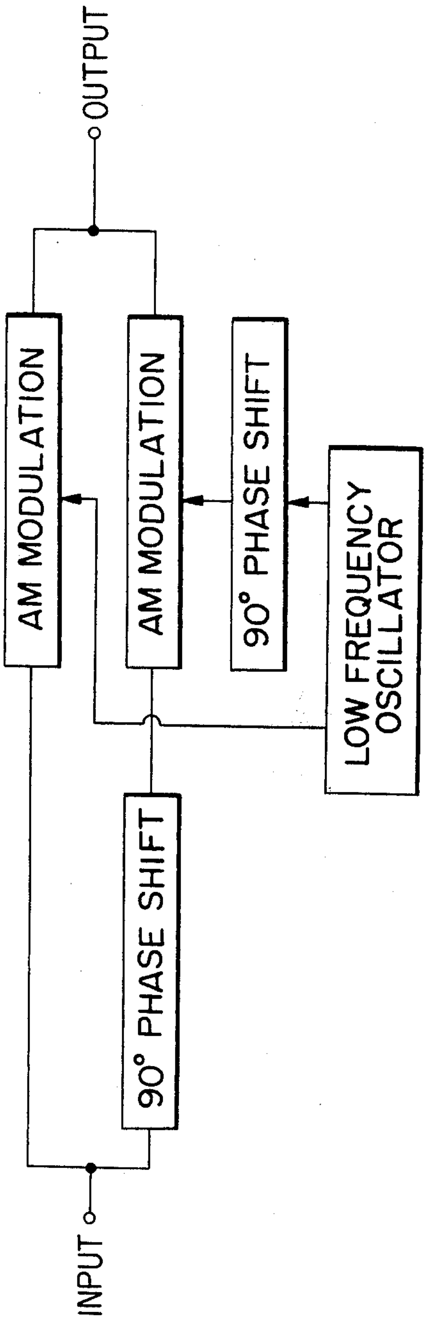
FIG. 3 PRIOR ART
FIGS. 2 and 3 are connection diagrams each showing a prior-art phase shifter circuit for an electronic musical instrument.
Figure 2:
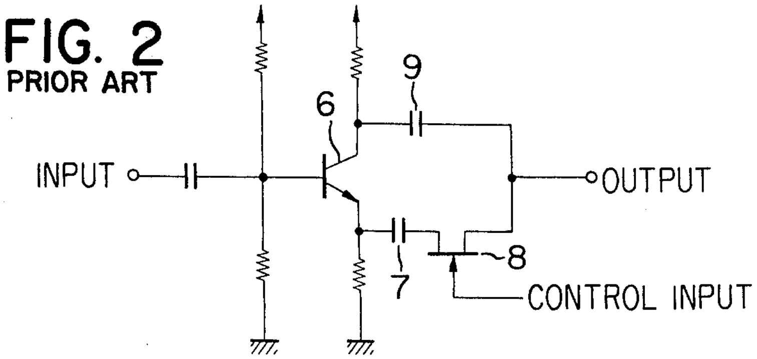
FIG. 2 PRIOR ART

FIGS. 2 and 3 show typical examples of prior-art phase shifter circuits of this sort. The example of FIG.

2 is the phase shifter circuit employing an FET, while the example of FIG. 3 is the phase shifter circuit of the AM modulation system. The phase shifter circuit shown in FIG. 2 is so constructed that the FET 8 is connected in series with a capacitor 7 to the emitter of a transistor 6, while a capacitor 9 is connected to the collector thereof, and that both the terminals remote from the transistor 6 are connected in common to form an output terminal. It is disadvantageous, however, in that since the output impedance on the collector side cannot be made very low, the amplitude becomes small at high frequencies. With the circuit shown in FIG. 3, the circuit itself becomes complicated. Besides, since it is originally directed to the phase modulation by low frequencies, it is hard to realize the voltage control by d.c. A further disadvantage is that the band of the phase modulation is narrow.

Figure 4:
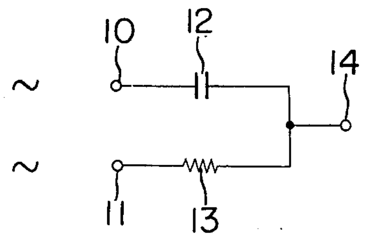
FIG. 4 is a diagram showing the fundamental form of a phase shifter circuit.

In order to facilitate understanding of this invention, the fundamental form of the phase shifter circuit as illustrated in FIG. 4 will be explained. Signals of phases opposite to each other as shown are applied to terminals 10 and 11 and are let to pass through a capacitor 12 and a resistance 13, respectively. Then, an output signal whose phase has been sifted within a range of from 0° to 180° in response to the frequency of the input signals is derived from a terminal 14. In order to vary the quantity of phase shift, the values of the capacitor 12 and the resistance 13 are rendered variable. It is the voltage-controlled phase shifter circuit that is adapted to control the values by the external voltage.

Figure 5:
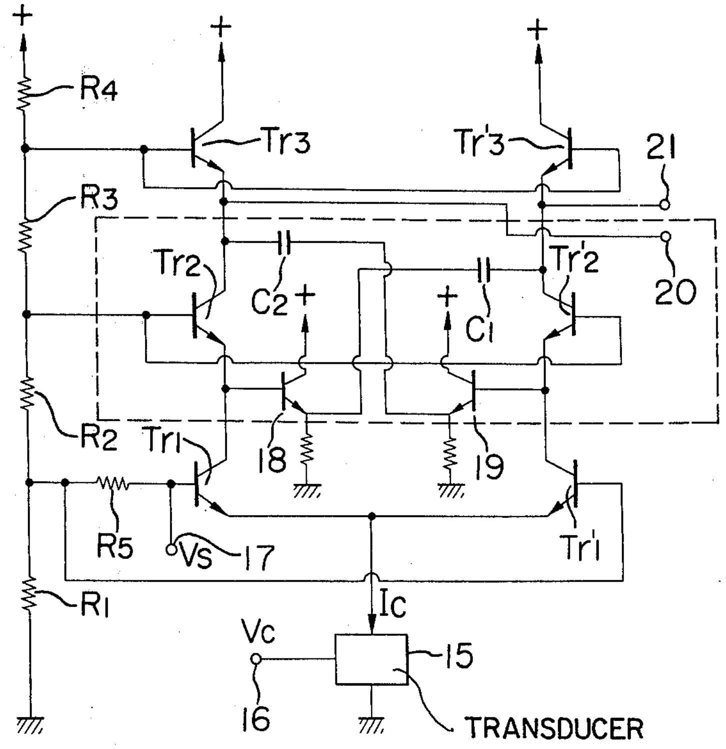
FIG. 5 is a connection diagram of the basic phase shifter circuit according to this invention.

An embodiment of the basic voltage-controlled phase shifter circuit according to this invention is illustrated in FIG. 5.

As shown in the figure, three stages of transistor pairs $Tr_1$, $Tr_1'$; $Tr_2$, $Tr_2'$; and $Tr_3$, $Tr_3'$, each stage consisting of a pair of transistors, have voltages divided by resistances $R_1$, $R_2$, $R_3$ and $R_4$ and are cascode-connected. The first stage of transistor pair $Tr_1$, $Tr_1'$ has the emitters connected in common, and both the emitters are grounded through a voltage-controlled transducer 15. In this circuit arrangement, the first stage of transistor pair $Tr_1$, $Tr_1'$ functions to change the emitter-collector current of each of the second stage of transistor pair $Tr_2$, $Tr_2'$ in relation of opposite phase to each other with respect to an input signal to be shifted which is applied to an input terminal 17 hereinafter described. A voltage-controlled transducer 15 functions to change the emitter-collector current of each of the second stage of transistor pair $Tr_2$, $Tr_2'$ in relation of same phase to each other with respect to the control voltage for amount of phase shift which is applied to a control terminal 16 hereinafter described. The voltage-controlled transducer 15 is provided with the control terminal 16 to which an external voltage for adjusting the quantity of phase shift is applied. A resistance $R_5$ is connected between the base of the transistor $Tr_1$ and the juncture of the voltage divider resistances $R_1$ and $R_2$. An input signal from an electronic musical instrument or the like is applied to the base of the transistor $Tr_1$ from the input terminal 17. The collector of the transistor $Tr_1$ is connected through an emitter follower 18 of low output impedance as well as a capacitor $C_1$ to the juncture between the second stage transistor $Tr_2'$ and the third stage transistor $Tr_3'$. Likewise, the collector of the transistor $Tr_1'$ is connected through an emitter follower 19 as well as a capacitor $C_2$ to the juncture between the second stage transistor $Tr_2$ and the third stage transistor $Tr_3$. The capacitors $C_1$ and $C_2$ are connected crosswise between a first transistor train which consists of one-side transistors $Tr_1$, $Tr_2$ and $Tr_3$ of the transistor pairs of the first, second and third stages and a second transistor train which consists of the other-side transistors $Tr_1'$, $Tr_2'$ and $Tr_3'$ of the respective stages. Output terminals 20 and 21 for deriving an output signal subjected to the phase modulation are respectively connected to the emitters of the transistors $Tr_3$ and $Tr_3'$ of the third stage.

The operation of the phase shifter circuit will now be described.

When the external control voltage $V_c$ is applied to the control terminal 16 of the voltage-controlled transducer 15, a control current $I_c$ flows through the transducer 15, and a current $I_c/2$ in phase or in the same phase flows through each of the first and second transistor trains. Under this state, the signal $V_s$ from the electronic musical instrument is applied to the input terminal 17 of the one transistor $Tr_1$ of the first stage. Then, when note is taken of only the a.c. component of the signal $V_s$, currents $I_s$ of phases opposite to each other flow through the respective transistors $Tr_1$ and $Tr_1'$. Thus, voltages $V_s/2$ of phases opposite to each other are generated at the emitters of the second stage transistors $Tr_2$ and $Tr_2'$. Simultaneously, the currents $I_s$ of phases opposite to each other flow through the collectors of the transistors $Tr_2$ and $Tr_2'$.

In a low region of the frequency of the input signal $V_s$, the impedance of the capacitor $C_2$ is high, so that a voltage having no phase shift (the quantity of phase shift is zero) and being inphase with the input signal is generated at the emitter of the one transistor $Tr_3$ of the third stage by only the current $I_s$ from the one transistor $Tr_2$ of the second stage. On the other hand, in a high region of the frequency of the input signal $V_s$, the impedance of the capacitor $C_2$ becomes lower than the base-emitter impedance of the transistor $Tr_3$, so that an antiphase voltage from the emitter follower 19 is generated at the emitter of the transistor $Tr_3$. Quite the same applies to the other transistor $Tr_3'$ of the third stage. The signal becomes inphase as regards a fluctuation in the current $I_c$, and antiphase as regards the input signal. Therefore, by subsequently passing the signal through the differential amplifier, the fluctuating component of the control current $I_c$ is canceled out, and only the signal component can be taken out at the output terminals 20 and 21. In this phase shifter circuit, the frequency at which the quantity of phase shift becomes 90° is proportional to the external control voltage $V_c$ according to the control current $I_c$.

Figure 6:
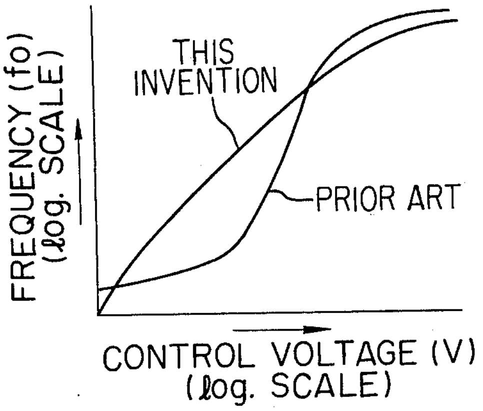
FIG. 6 is a graph showing the phase shift characteristic of the phase shifter circuit of this invention in comparison with that in the prior art.

FIG. 6 illustrates the phase shift characteristic of the above phase shifter circuit in comparison with that of the prior-art circuit employing the FET. In the diagram, the axis of abscissas represents the control voltage V, and the axis of ordinates the frequency $f_o$ at which the quantity of phase shift becomes 90°. Both the axes are indicated by logarithmic scales. As apparent from the graph, in accordance with the phase shifter circuit of this invention, the control voltage and the frequency are proportional over a very wide range. Accordingly, the linearity in the case of conducting the phase modulation is good, and the operating point of the phase modulation can be freely set. On the other hand, in accordance with the prior-art phase shifter circuit employing the FET, although the frequency $f_o$ certainly varies over a wide range, the gradient of the frequency - versus - control voltage curve differs greatly in dependence on the position of the operating point, and hence, the linearity in the case of conducting the phase modulation is bad. Of course, the setting of the operating point is difficult.

Figure 7:
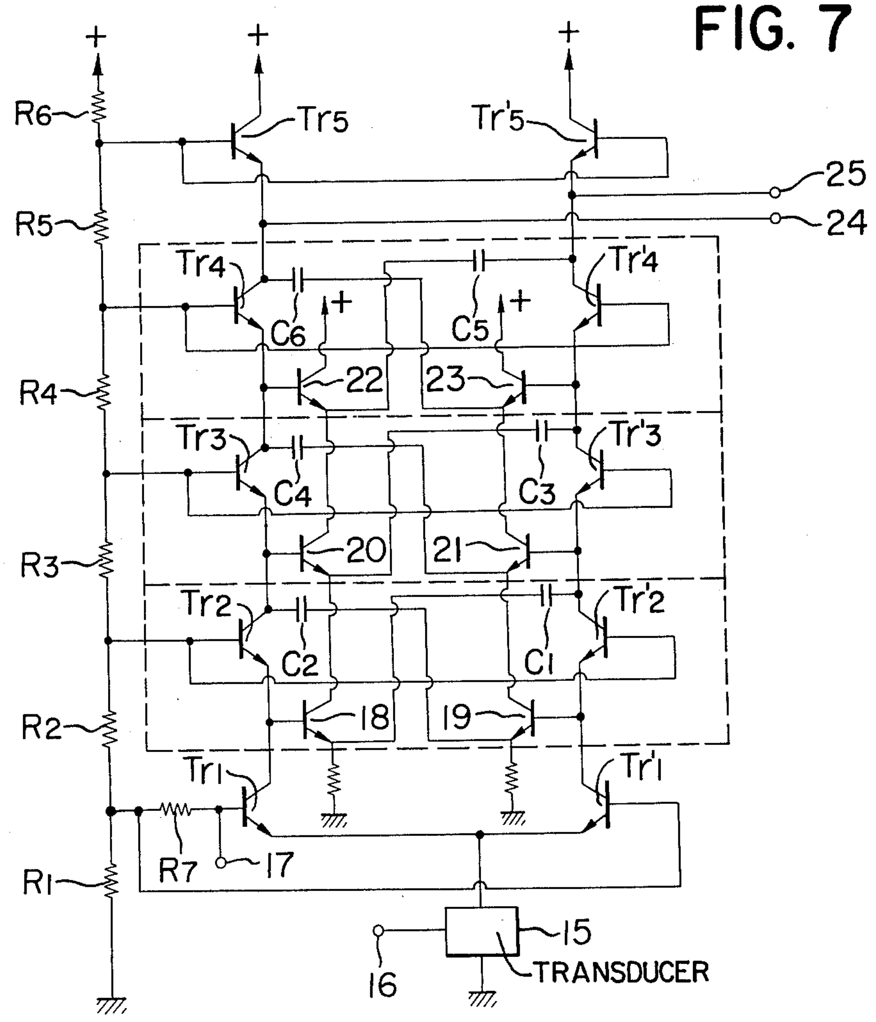
FIG. 7 is a connection diagram of a phase shifter circuit of this invention in which five stage are connected.

The maximum quantity of phase shift of the voltage-controlled phase shifter circuit is 180°. The quantity of phase shift can be easily increased in such a way that a circuit stage or a circuit arrangement consisting of the transistor pair $Tr_2$, $Tr_2'$, the emitter followers 18, 19 and the capacitors $C_1$, $C_2$ connected in series with the emitter followers is considered to be one unit (a portion enclosed with dotted lines in FIG. 5) and that several such units or circuit stages are cascode-connected. FIG. 7 shows a phase shifter circuit in which three circuit stages are connected in cascade.

In FIG. 7, the connections of voltage divider resistances $R_1 - R_6$, first to fifth stages of transistor pairs $Tr_1$, $Tr_1'$; $Tr_2$, $T_2'$; $Tr_3$, $Tr_3'$; $Tr_4$, $Tr_4'$; and $Tr_5$, $Tr_5'$, a voltage-controlled transducer 15 and a base resistance $R_7$ of the transistor $Tr_1$ of the first stage, and an external control terminal 16 as well as an input terminal 17 are quite the same as in the phase shifter circuit of FIG. 5. The explanation is therefore omitted. The collector of the transistor $Tr_1$ of the first stage is connected through an emitter follower 18 as well as a capacitor $C_1$ to the juncture between the transistor $Tr_2'$ of the second stage and the transistor $Tr_3'$ of the third stage. Likewise, the collector of the transistor $Tr_1'$ of the first stage is connected through an emitter follower 19 as well as a capacitor $C_2$ to the juncture between the transistor $Tr_2$ of the second stage and the transistor $Tr_3$ of the third stage. The collector of the transistor $Tr_2$ of the second stage is connected through an emitter follower 20 as well as a capacitor $C_3$ to the juncture between the transistor $Tr_3'$ of the third stage and the transistor $Tr_4'$ of the fourth stage, while the collector of the transistor $Tr_2'$ of the second stage is connected through an emitter follower 21 as well as a capacitor $C_4$ to the juncture between the transistor $Tr_3$ of the third stage and the transistor $Tr_4$ of the fourth stage. Similarly, the collector of the transistor $Tr_3$ of the third stage is connected through an emitter follower 22 as well as a capacitor $C_5$ to the juncture between the transistor $Tr_4'$ of the fourth stage and the transistor $Tr_5'$ of the fifth stage, while the collector of the transistor $Tr_3'$ of the third stage is connected through an emitter follower 23 as well as a capacitor $C_6$ to the juncture between the transistor $Tr_4$ of the fourth stage and the transistor $Tr_5$ of the fifth stage.

The operation of this circuit is quite the same as the operation explained in connection with FIG. 5, and is not repeatedly set forth. An output signal subjected to the phase modulation is derived from output terminals 24 and 25. The maximum quantity of phase shift of the output signal is $180° \times 3 = 540°$.

In the phase shifter circuits shown in FIGS. 5 and 7, the first stage of transistor pair $Tr_1$, $Tr_1'$ is used as means for changing the emitter-collector current of each of the second stage of transistor pair $Tr_2$, $Tr_2'$ in relation of opposite phase to each other with respect to an input signal to be shifted and a voltage-controlled converter is used as means for changing the emitter-collector current of each of the second stage of transistor pair $Tr_2$, $Tr_2'$ in relation of same phase to each other with respect to the control voltage for amount of phase shift. It is important to understand that these transistor pair $Tr_1$, $Tr_1'$ and the voltage-controlled converter are used merely by way of example and that any other means or methods can be employed for achieving the same purposes. Furthermore, any low output impedance circuit can be used instead of the emitter follower.

According to the voltage-controlled phase shifter circuit of this invention stated above, the quantity of phase shift can be linearly varied by the external voltage, and besides, the quantity of phase shift can be made large by increasing the number of stage simply. Consequently, when the phase shifter circuit is used in combination with the electronic musical instrument, a smooth modulation is applied and distinct sounds are produced. In addition to the advantages in the electric and acoustic characteristics as described above, the phase shifter circuit according to this invention has the advantages that the circuit arrangement becomes simple, and that since the number of stages to be cascode-connected may be smaller than in case of obtaining the same quantity of phase shift with the prior-art phase shifter circuit, the cost of the circuit itself can be sharply reduced conjointly with inexpensiveness of the elements employed.

While a preferred embodiment of the invention has been described using specific terms, such description is for illustrative purposes only, and it is to be understood that changes and variations may be made without departing from the spirit or scope of the following claims.

What we claim is:

1. A voltage-controlled phase shifter circuit for an electronic musical instrument comprising:

a plurality of stages of cascode-connected transistor pairs, each stage of transistor pair consisting of a pair of transistors each of which has its collector connected to the emitter of each corresponding transistor in the following stage of transistor pair and has its base maintained at a constant potential;

means connected to the emitter of each transistor in the first stage of transistor pair of said a plurality of stages of cascode-connected transistor pairs for changing the emitter-collector current of said each transistor in said first stage of transistor pair in relation of opposite phase to each other with respect to the signal to be transferred; and means for changing the emitter-collector current of each transistor in each stage of transistor pair in relation of same phase to each other with respect to the control voltage for amount of phase shift, one of a pair of transistors in each stage of transistor pair having its emitter connected through an impedance conversion circuit and a capacitor to the collector of the other of the pair of transistors in the same stage of transistor pair and said other of the pair of transistors having its emitter connected through an impedance conversion circuit and a capacitor to the collector of said one of the pair of transistors, whereby the signal derived at the final stage of transistor pair of said at least one stage of transistor pair cascode-connected is shifted from the signal applied to said first stage of transistor pair.

2. A voltage-controlled phase shifter circuit as set forth in claim 1 wherein said impedance conversion circuit is an emitter follower.

3. A voltage-controlled phase shifter circuit as set forth in claim 1 wherein said means for changing the emitter-collector current of each transistor in said first stage of transistor pair in relation of opposite phase to each other with respect to the signal to be shifted is a pair of transistors with their emitters connected to each other.

4. A voltage-controlled phase shifter circuit as set forth in claim 1 wherein said means for changing the emitter-collector current of each transistor in each stage of transistor pair in relation of same phase with respect to the control voltage for amount of phase shift is a voltage-current conversion circuit which is connected to the emitter of each transistor in the first stage of transistor pair and is controllable from outside by means of a phase control voltage.

5. A voltage-controlled phase shifter circuit as set forth in claim 1 wherein a pair of transistors in each stage of transistor pair have their bases connected to each other.

6. A voltage-controlled phase shifter circuit as set forth in claim 5 wherein the bases of a pair of transistors in the respective stage of transistor pair are voltage-divided by a resistor.

* * * * *